United States Patent [19]
Bagley et al.

[11] Patent Number: 4,920,078
[45] Date of Patent: Apr. 24, 1990

[54] ARSENIC SULFIDE SURFACE PASSIVATION OF III-V SEMICONDUCTORS

[75] Inventors: Brian G. Bagley, Watchung; Thomas J. Gmitter, Lakewood; Eli Yablonovitch, Leonardo, all of N.J.

[73] Assignee: Bell Communications Research, Inc., Livingston, N.J.

[21] Appl. No.: 360,414

[22] Filed: Jun. 2, 1989

[51] Int. Cl.$^5$ .............. H01L 21/00; H01L 21/02; H01L 21/302; B05D 5/12
[52] U.S. Cl. ............................ 437/243; 437/225; 437/228; 437/231; 437/235; 437/980; 427/96; 427/126.2; 357/72; 357/73
[58] Field of Search ............... 437/225, 228, 235, 243; 148/DIG. 1, DIG. 56; 427/126.2, 269, 287; 501/1, 11, 140, 150; 65/3.2, 32.1, 32.4, 60.1

[56] References Cited

U.S. PATENT DOCUMENTS

| | | | |
|---|---|---|---|
| 4,026,741 | 5/1977 | Chang et al. | 204/56.1 |
| 4,095,011 | 6/1978 | Hawrylo | 428/469 |
| 4,439,464 | 3/1984 | Lauks | 437/229 |
| 4,447,469 | 5/1984 | Peters | 437/938 |
| 4,560,576 | 12/1985 | Lewis et al. | 427/38 |
| 4,751,200 | 6/1988 | Gmitter | 437/225 |
| 4,751,201 | 6/1988 | Nottenburg | 437/225 |

OTHER PUBLICATIONS

"Nearly Ideal Electronic Properties of Sulfide Coated GaAs Surfaces," *Applied Physics Letters*, E. Yablonovitch et al., 1987, vol. 51, No. 6, pp. 439–441.

"Electronic Passivation of GaAs Surfaces Through the Formation of Arsenic-Sulfur Bonds," *Applied Physics Letters*, C. J. Sandroff et al., 1989, vol. 54, No. 4, pp. 362–364.

"Influence of the Substrate on the Electrical Properties of $As_2S_3$ Films", *Soviet Physics Semiconductors*, 1985, Y. G. Fariver et al., vol. 19, No. 7, pp. 795–797.

"Monocrystalline Aluminum Ohmic Contact to n–GaAs by $H_2S$ Adsorption," *Applied Physics Letters*, J. Massies et al., 1981, vol. 38, No. 9, pp. 693–695.

"Effects of $H_2S$ Adsorption on Surface Properties of GaAs {100} Grown In Situ by MBE," *Journal of Vacuum Science Technology*, J. Massies et al., 1980, vol. 17, No. 5, pp. 1134–1140.

"Effects of Cations on the Performance of the Photoanode in the n–GaAs/$K_2$Se–KOH/C Semiconductor Liquid Junction Solar Cell," *Journal of the Electrochemical Society*, B. A. Parkinson et al., 1979, vol. 126, No. 6, pp. 954–960.

"Advances in SQUID Magnetometers," *IEEE Transactions on Electron Devices*, J. Clarke, 1980, vol. ED-27, No. 10, pp. 1896–1908.

"Surface Passivation of GaAs," *Applied Physics Letters*, H. H. Lee et al., 1989, vol. 54, No. 8, pp. 724–726.

Colclaser, R., Microelectronics: Processing and Device Design, Wiley & Sons, 1980, p. 81.

*Primary Examiner*—Brian E. Hearn
*Assistant Examiner*—B. Everhart
*Attorney, Agent, or Firm*—James W. Falk; Charles S. Guenzer

[57] ABSTRACT

A method of passivating GaAs and InGaAs by growing on the GaAs or InGaAs used for semiconducting devices a surface film of glassy $As_2S_3$ which acts as a passivating layer. The film growth is preferably done by precipitating $As_2S_3$ from a solution containing $NH_4OH$, so as to make it basic, and then annealing the precipitated film at a temperature between the glass transition temperature (200° C.) and the melting point (315° C.) of $As_2S_3$.

21 Claims, 2 Drawing Sheets

ARSENIC SULFIDE SURFACE PASSIVATION OF III-V SEMICONDUCTORS

FIELD OF THE INVENTION

The invention relates to electronic devices. In particular, the invention relates to an electrical passivation of a semiconductor material.

BACKGROUND ART

Compound semiconductors, such as the III-V material GaAs, offer many advantages over silicon for advanced semiconductor devices. GaAs in particular has been developed for high speed integrated circuits. However, GaAs, as well as other III-V and II-VI semiconductors, suffer from poor electronic surface quality. That is, the surface provides electrical traps and defects which remove carriers from the underlying semiconductor. The surface problem is much less severe in silicon since the oxide $SiO_2$ provides a good passivating surface to Si. It is known that the quality of surface passivation can be quantified in terms of the surface recombination velocity $S_o$. The lower the value of $S_o$, the better is the passivation. Thermally oxidized silicon shows a surface recombination velocity of $\sim 100$ cm/s while GaAs shows a value no better than $\sim 10^6$ cm/s.

Two of the three present inventors described the passivation problem in their U.S. Pat. No. 4,751,200, issuing in the names of Gmitter et al. They were able to passivate GaAs by applying a solution of $Na_2S.9H_2O$ to a cleaned GaAs substrate and to thereby form a sodium sulfide passivating film thereupon. The film was about 0.5 $\mu$m thick. Thereby, the surface recombination velocity of the GaAs was reduced by a factor 60 or 100, that is $S_o \sim 10^4$ cm/sec.

Commonly assigned U.S. Pat. No. 4,751,201, issued in the names of Nottenburg et al, disclosed how the method of Gmitter et al could be applied to actual electronic devices, such as a vertical GaAs transistor.

These results of Gmitter et al were a distinct advance over the prior art. Nonetheless, the electrical passivation of GaAs still was poor compared to Si. More importantly, it was discovered that the sodium sulfide passivation of GaAs was not stable. Although $S_o$ was initially measured at around $10^4$ cm/sec, it was discovered that $S_o$ thereafter began to and continued to increase to unacceptable values. Therefore, this prior work did not provide a satisfactory commercial process for passivating GaAs.

Yablonovitch et al in a technical article entitled "Nearly ideal electronic properties of sulfide coated GaAs surfaces" appearing in Applied Physics Letters, volume 51, 1987 at pages 439-441 disclose both the subject matter of the Gmitter et al patent but also the use of $(NH_4)_2S$ as a passivating material. They further report on wafer treatment in an aqueous base. Sandroff et al have disclosed a similar passivating technique in a technical article entitled "Electronic passivation of GaAs surfaces through the formation of arsenic-sulfur bonds" appearing in Applied Physics Letters, volume 54, 1989 at pages 362-364. No heat treatment is described in either reference and the method is believed to not provide satisfactory passivation.

Those same two present inventors have filed U.S. patent application, Ser. No. 087,420, on Aug. 21, 1987. This application discloses a passivating sodium hydroxide film for a semiconductor material of $In_{0.52}Ga_{0.47}As$. Without the passivating film, the InGaAs showed a surface recombination velocity of $\sim 5000$ cm/s. The sodium hydroxide film reduced the value of $S_o$ to $\sim 200$ cm/s. Although it was observed that $S_o$ increased by a factor of two within a few days, thereafter it remained essentially constant for at least four weeks.

Hawrylo et al disclose in U.S. Pat. No. 4,095,011 the surface passivation of a GaAs light emitting diode by a passivating layer of $As_2S_3$, $As_2Se_3$ or $As_2Te_3$. The film was deposited in a diffusion furnace operating near 640° with the $As_2S_3$ source a few degrees cooler. These temperatures are well above the melting temperature of 315° C. for $As_2S_3$. No experimental results were disclosed. This method does not seem to be further reported in the literature and has not found widespread acceptance.

Fariver et al in a technical article entitled "Influence of the substrate on the electrical properties of $As_2S_3$ films" appearing in Soviet Physics, Semiconductors, Vol. 19, No. 7, 1985 at pages 795-797 investigate the electrical properties of a glassy $As_2S_3$ film formed on different types of substrates by vacuum deposition. One of these substrates was n-type GaAs. Their work describes only the electrical characteristics of the $As_2S_3$ film and some hypothetical heterojunction characteristics between the $As_2S_3$ and the substrate.

SUMMARY OF THE INVENTION

Accordingly, it is an object of this invention to provide surface electrical passivation for GaAs and other III-V and II-VI semiconductors.

It is a further object to provide such electrical passivation which does not degrade with time.

The invention can be summarized as a surface passivation for GaAs and other compound semiconductors in which the semiconductor surface is coated with a thin film of a chalcogenide glass such as arsenic trisulfide. The thin film is formed by depositing the chalcogenide on the semiconductor surface, cleaned with a basic solution, at a low temperature and then annealing it above its glass transition temperature but below its melting point.

DETAILED DESCRIPTION OF THE PREFERRED EMBODIMENTS

Figure 1:
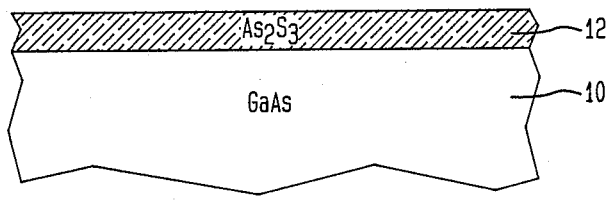
FIG. 1 is a cross section of a surface passivated GaAs semiconductor according to the invention.

The inventors have discovered that one particular type of sulfide film provides an effective and long lasting passivating layer on GaAs, namely, a glassy $As_2S_3$ film formed under basic conditions from a solution containing $(NH_4)^+$ and $As_2S_3$. As illustrated in FIG. 1, a substrate 10 of semiconducting GaAs is cleaned and then a passivating layer 12 of glassy $As_2S_3$ is formed thereon. The passivating layer 12 may be deposited on the GaAs in a precursor form of the $As_2S_3$ glass dissolved in $NH_4OH$ solution. The passivating layer 12 is then raised to above the glass transition temperature of $As_2S_3$ so that the $As_2S_3$ is densified and formed into a glass in contact with the surface of the GaAs.

EXAMPLE 1

Figure 2:
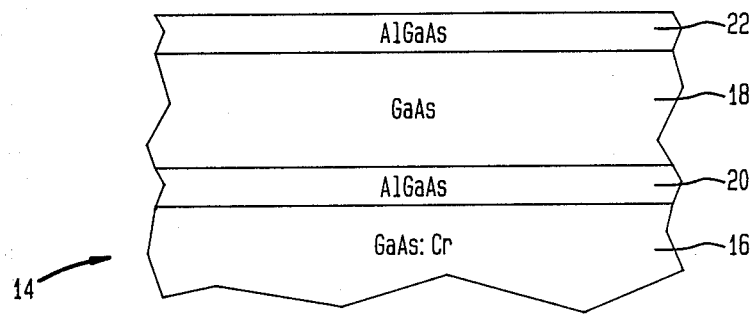
FIG. 2 is a cross section of a sample to which the invention was applied.

One method of forming such a glassy $As_2S_3$ passivating layer 12 relies upon a precipitation method. As illustrated in FIG. 2, a test sample 14 was formed by depositing epitaxial layers on a semi-insulating substrate of GaAs doped with Cr. The deposition was by the organo-metallic growth deposition (OMCVD) process, which is well known. The structure consisted of a layer 18 of GaAs of 2 μm thickness sandwiched between two thin layers 20 and 22 of $Al_{0.5}Ga_{0.5}As$. These thin layers 20 and 22 had a thickness of about 100 nm. Reference is made to Nottenburg et al for more details of the growth process. At this point, the minority carrier lifetime of the GaAs layer 18 was a relatively good 215 ns owing to its epitaxial interface with the top AlGaAs layer 22.

The top AlGaAs layer 22 was removed by submersing the sample 14 in hydroflouric acid, followed by a deionized water rinse and nitrogen drying. Thereafter, the surface of the GaAs layer 18 was cleaned by etching the top surface for 5 seconds with a 1:8:500 solution of $H_2SO_4:H_2O_2:H_2O$. The etching was immediately followed by the rinsing and drying sequence. The GaAs surface was believed to be oxide coated at this point, the minority carrier lifetime had degraded to less than 10 ns.

An $As_2S_3$ precipitation solution was prepared. It was a 0.27M $As_2S_3/NH_4OH$ solution which was made slightly richer in S by about 3 molar percent by the addition of a small quantity of $(NH_4)_2S$. There results a 0.27M $As_2S_{3+}/NH_4OH$ solution. The excess S is not absolutely required.

The sample was then placed in the 0.27M $As_2S_{3+}/NH_4OH$ solution for a minimum of 5 minutes. The minority carrier lifetime was monitored in situ in the solution and was measured to be 207 ns. The sample was removed from the solution and the remaining solvent was evaporated under the flow of $N_2$, which permitted the $As_2S_3$ to precipitate onto the GaAs surface. The lifetime was again measured and was found to be 78 ns, yield $S_0 \approx 1650$ cm/s at a carrier density of $5 \times 10^{15}$ cm$^{-3}$. It is believed that the $As_2S_3$ precipitated in the form of small molecular clusters and short chain polymers. As such, the precipitate was not completely covalently bonded to the GaAs, which explains the poor lifetime. Furthermore, at this stage the As and S were not bonded together in the form of a glassy three-dimensional $As_2S_3$ network. We have attempted to use the as-precipitated film as the passivating layer but have discovered that $S_o$ degrades after a few months.

Figure 3:
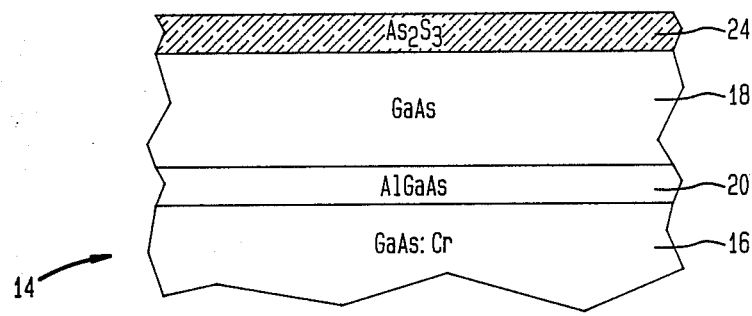
FIG. 3 is a cross section of the sample of FIG. 2 with the passivation applied.

Thereafter, an annealing step was performed on the precipitated film. It was found important to protect the unannealing film from oxygen at annealing temperatures. Therefore, the following firing cycle was developed. The room-temperature film was loaded into a cold quartz tube. A flow of a non-oxidizing gas of 2 liters per minute was established through the tube. The purge gas used was either $N_2$ or forming gas (5% $H_2$ and 95% $N_2$). The cold tube and film were purged for 10 minutes before the tube was placed in a furnace heated to 290° C. A heating cycle of 7 minutes was used of which 4 minutes were required to raise the tube to the elevated temperature. After the heating cycle, the tube was removed from the furnace and cooled for 10 minutes. The flow of the non-oxidizing gas continued during the heating and subsequent cooling. Thereby, as illustrated in FIG. 3, a glassy $As_2S_3$ film 24 was formed over the GaAs layer 18. The thickness of the film 24 was about 10 μm. The lifetime was measured to be 120 ns at a carrier density of $5 \times 10^{15}$ cm$^{-3}$, yielding a value of $S_0 \approx 750$ cm/s and has not changed thereafter for at least three months.

The annealing temperature of 290° C. was between the glass transition temperature of 200° C. and the melting temperature of 315° C. for $As_2S_3$. Since the glass transition temperature does not mark a well defined transition, annealing temperatures slightly lower than the glass transition temperature could be used but the heating time would need to be markedly increased in order to achieve the same result. Annealing temperatures above the melting temperature should be avoided. Above its melting temperature, components of $As_2S_3$ can selectively evaporate and it can react excessively with the underlying GaAs.

EXAMPLE 2

In a second example, the $As_2S_3$ was spun on rather than precipitated. A coating solution was prepared by mixing a 0.16M $As_2S_3/NH_4OH$ solution was methanol in a ratio of 2:1 by volume. The pH of the solution was 10.6 both before and after mixing with the methanol. A 0.27M solution was used with the same passivating effect. The GaAs substrate was then immersed in the coating solution for 5 minutes at room temperature. The sample was then spun dry at 2000 rpm, as is standard thin-film semiconductor fabrication technique. The thickness of the film on average across the substrate was about 150 nm. This thickness could be adjusted by changing the concentration of the $As_2S_3$ in solution and/or the spin speed. Thereafter, the film-coated GaAs substrate was annealed in the standard firing cycle at 290° C. in an $N_2$ ambient. Good surface passivation was observed to endure unchanged for 2 months at least.

EXAMPLE 3

In a third example, the $As_2S_3$ passivation was applied to InGaAs. On a Fe-doped InP substrate, there was grown by OMCVD a layered structure of an InP buffer layer, an $In_{0.53}Ga_{0.47}As$ test layer and a top layer of InP. In the unprocessed sample, the lifetime was measured to be 160 ns.

The sample was processed similarly to the GaAs samples with a few exceptions. The top InP layer was removed by etching in HCl. The oxidized etched sample showed a lifetime of 52 ns. The $As_2S_3$ coating solution was applied by spin coating. The standard firing cycle was modified so that the furnace was held at 200° C.

The processed InGaAs film showed a lifetime of 116 ns, yielding $S_0 \approx 660$ cm/s at a carrier density of $1 \times 10^{16}$ cm$^{-3}$, which has not changed after 23 days.

In all of the above examples, the $As_2S_3$ was applied from a basic solution. The high pH cleans the GaAs surface simultaneously with the deposition of the protective film. Although the pH of the coating solution used was 10.6, similar effects are expected at a pH extending down to at least 9.0. Efforts to grow the $As_2S_3$ film from neutral or acid solutions failed to provide good passivation. In the above two examples, it is believed that the arsenic sulfide deposited from the basic solution predominantly in the form of molecular clusters. During the subsequent annealing or glass forming, the molecular clusters provide a ready supply of covalent bonds to the underlying GaAs as it is converted to the glassy $As_2S_3$ three-dimensional network form. The coating solution can be applied to the substrate by other processes such as spray coating. The invention can be further applied to other processes of forming the $As_2S_3$ film if the film assumes the glassy state while in contact with the GaAs and if the GaAs has a clean and non-oxidized surface. For example, the GaAs surface can be cleaned with $(NH_4)_2S$ and then the $As_2S_3$ can be subsequently evaporated thereon. Once the semiconductor interface has been passivated by the glassy $As_2S_3$ film, subsequent films of other materials can be deposited so long as their preparation is compatible with and does not destroy the passivating film.

$As_2S_3$ is only one of many chalcogenide glasses, other examples of which are $As_2Se_3$, $As_2Te_3$, and their alloys $As_2(S,Se,Te)_3$. The invention can additionally be applied with the chalcogenide glass group as a whole.

Figure 4:
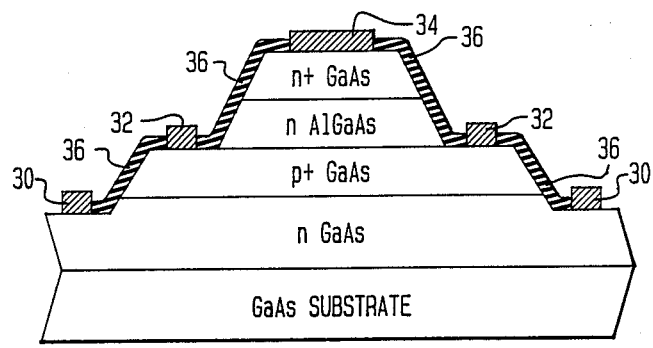
FIG. 4 is a cross section of a transistor passivated according to the present invention.

Any of the above processes can be used with actual devices, for instance, the heterojunction bipolar transistor described by Nottenburg et al and illustrated in FIG. 4. First, a transistor with an n-AlGaAs emitter, a $p^+$-GaAs base, and an n-GaAs collector is grown and patterned, as described by Nottenburg et al. Then alloyed metal contacts 30, 32 and 34 are selectively deposited to provide contacts to the collector, base and emitter respectively. Finally, an $As_2S_3$ film 36 is grown according to the process of the present invention.

Thus the present invention provides an effective means of passivating GaAs and InGaAs. The invention is also applicable to other III-V and II-VI semiconductors. The method is simple and inexpensive to use. Experimental results demonstrate that the passivation is long enduring.

What is claimed is:

1. A method for passivating a semiconductor, comprising:
   coating a film of a chalcogenide glass on a semiconductor substrate, said coating step including cleaning said substrate with a basic solution, wherein said film is coated on said substrate in a form of a precursor of said chalcogenide glass while said substrate is at a coating temperature below a melting temperature of said chalcogenide glass; and
   heating said precursor coated substrate at an annealing temperature above a glass transition temperature of said chalcogenide glass.

2. A method as recited in claim 1, wherein said chalcogenide glass comprises arsenic sulfide.

3. A method as recited in claim 2, wherein said basic solution comprises $NH_4OH$.

4. A method as recited in claim 2, wherein said basic solution comprises $(NH_4)_2S$.

5. A method as recited in claim 2, wherein said semiconductor substrate comprises a III-V semiconductor.

6. A method for passivating a semiconductor, comprising:
   precipitating a precursor of a chalcogenide glass from a basic solution onto a semiconductor substrate; and
   heating said precipitated precursor at an annealing temperature below a melting temperature of said chalcogenide glass.

7. A method as recited in claim 6, wherein said chalcogenide glass comprises arsenic sulfide and said annealing temperature is above or approximately at a glass transition temperature of said arsenic sulfide.

8. A method as recited in claim 1, wherein said basic solution comprises $NH_4OH$.

9. A method as recited in claim 1, wherein said basic solution comprises $(NH_4)_2S$.

10. A method as recited in claim 1, wherein said solution comprises $As_2S_{3+z}$ and $(NH_4)_2S$ and $0 < z < 1$.

11. A method for passivating a semiconductor, comprising:
    flooding a semiconductor substrate with a basic solution containing a precursor of a chalcogenide glass;
    spin drying said substrate after said flooding step; and
    heating said precursor on said substrate after said spin drying step at an annealing temperature below a melting temperature of said chalcogenide glass.

12. A method as recited in claim 11, wherein said annealing temperature is above or approximately equal to a glass transition temperature of said arsenic sulfide.

13. A method as recited in claim 12, wherein said solution comprises $As_2S_3$ and $NH_4OH$.

14. A method as recited in claim 12, wherein said solution comprises $As_2S_{3+z}$ and a base and z is between 0 and 1.

15. A method as recited in claim 2, further comprising fabricating at least one electronic device in said semiconductor substrate prior to said coating step, said device including at least one region of $In_xGa_{1-x}As$, wherein $0 \leq x \leq 1$.

16. A method as recited in claim 1, further comprising fabricating at least one electronic device in said semiconductor substrate prior to said coating step.

17. A method of passivating a III-V semiconductor, comprising the steps of:
    applying to a surface of a III-V semiconductor a solution containing arsenic sulfide and ammonium hydroxide; and
    then heating said surface in a non-oxidizing atmosphere at a temperature between 200° C. and 315° C.

18. A method as recited in claim 17, wherein said semiconductor comprises GaAs and said temperature is between approximately 290° C. and 315° C.

19. A method for passivating a semiconductor, comprising:
    coating a film of a chalcogenide glass comprising arsenic sulfide on a semiconductor substrate comprising $In_xGa_{1-x}As$, wherein $0 \leq x \leq 1$, said coating step including cleaning said substrate with a basic solution.

20. A method as recited in claim 6 wherein said chalcogenide glass comprises arsenic sulfide.

21. A method as recited in claim 11, wherein said chalcogenide glass comprises arsenic sulfide.

* * * * *